(12) United States Patent
Ito et al.

(10) Patent No.: US 7,378,728 B2
(45) Date of Patent: May 27, 2008

(54) ELECTRONIC COMPONENT MOUNTING PACKAGE AND PACKAGE ASSEMBLED SUBSTRATE

(75) Inventors: Hideki Ito, Daito (JP); Masanori Hongo, Hirakata (JP); Masami Fukuyama, Higashiosaka (JP); Hiroyuki Taguchi, Daito (JP); Hideki Takagi, Daito (JP)

(73) Assignee: Sanyo Electric Co., Ltd., Osaka (JP)

( * ) Notice: Subject to any disclaimer, the term of this patent is extended or adjusted under 35 U.S.C. 154(b) by 40 days.

(21) Appl. No.: 11/389,330

(22) Filed: Mar. 27, 2006

(65) Prior Publication Data

US 2006/0220233 A1 Oct. 5, 2006

(30) Foreign Application Priority Data

Mar. 31, 2005 (JP) .............................. 2005-104956

(51) Int. Cl.
*H01L 23/48* (2006.01)
(52) U.S. Cl. ....................... 257/693; 438/125
(58) Field of Classification Search ................ 257/693, 257/701, 81, 99; 438/118, 125
See application file for complete search history.

(56) References Cited

U.S. PATENT DOCUMENTS

| | | | |
|---|---|---|---|
| 5,451,716 A * | 9/1995 | Hasegawa et al. .......... 174/527 |
| 6,372,985 B1 * | 4/2002 | Shimoe ....................... 174/520 |
| 6,608,366 B1 * | 8/2003 | Fogelson et al. ........... 257/666 |
| 6,913,950 B2 * | 7/2005 | Kobayakawa ............... 438/113 |
| 6,919,624 B2 * | 7/2005 | Tani et al. ................... 257/684 |

FOREIGN PATENT DOCUMENTS

| | | |
|---|---|---|
| JP | 6-96992 | 4/1994 |
| JP | 2002-232017 | 8/2002 |

* cited by examiner

*Primary Examiner*—S. V. Clark
(74) *Attorney, Agent, or Firm*—Westerman, Hattori, Daniels & Adrian, LLP.

(57) ABSTRACT

A package of the present invention has a laminate structure of a plurality of ceramic layers, and includes a cavity for housing a light emitting element. A mount surface is defined on a side surface parallel with the depth direction of the cavity. A pair of external electrodes each including a charged electrode portion and a coated electrode portion are formed over the entire length in the laminating direction at two corners defined by intersection of the mount surface and two side surfaces perpendicular to the mount surface. When the package is mounted, a pair of charged electrode portions and a pair of coated electrode portions are soldered to a surface of a substrate.

3 Claims, 14 Drawing Sheets

ELECTRONIC COMPONENT MOUNTING PACKAGE AND PACKAGE ASSEMBLED SUBSTRATE

The priority application Number 2005-104956 upon which this patent application is based is hereby incorporated by reference.

BACKGROUND OF THE INVENTION

1. Field of the Invention

The present invention relates to an electronic component mounting package having a laminate structure of a plurality of ceramic layers and a manufacturing method therefor, and to a package assembled substrate, which is an intermediate product thereof.

2. Description of Related Art

An electronic component mounting package 4, as shown in FIG. 15 and FIG. 16, formed by laminating a plurality of ceramic layers has been conventionally known (see JP 2002-232017, A). A cavity 43 for housing a light emitting element such as an LED is provided in the middle of the package 4. A mount surface 44 to be a joint surface when the package is mounted on a mother board is defined on a reverse surface parallel with the depth direction of the cavity 43. A pair of recesses are defined over the entire length in the depth direction of the cavity 43 at corners where the mount surface 44 of the package 4 intersects side surfaces perpendicular to the mount surface 44. A film of a conductive material is formed on the surface of each of the recesses to form a pair of external electrodes 40, 40. The plurality of ceramic layers constituting the package 4 are laminated in the depth direction of the cavity 43. After through holes penetrating through all the ceramic layers are provided, the pair of external electrodes 40, 40 are formed by forming films of a conductive material such as silver on inner surfaces of the through holes.

In the above-described package 4, as shown in FIG. 17 to FIG. 19, the pair of external electrodes 40, 40 are soldered to a surface of a mother board 30 with the mount surface 44 of the package 4 being opposed to the surface of the mother board 30, i.e., with the opening direction of the cavity 43 of the package 4 being parallel with the surface of the mother board 30. As shown in FIG. 18 and FIG. 19, a solder portion 31 is formed between each external electrode 40 of the package 4 and the surface of the mother board 30. The solder portion 31 includes a base portion 32 between the surface of the mother board 30 and a surface of the external electrode 40 exposed to the mount surface 44, and a fillet portion 33 extending from the surface of the mother board 30 toward a surface of the external electrode 40 exposed to the side surface perpendicular to the mount surface 44.

However, in the mounted structure of the package 4, because the area of the external electrode 40 exposed to the mount surface 44 is extremely small, a joint area of the base portion 32 of the solder portion 31, i.e., mounting area cannot be sufficiently secured. This has been causing a problem of an insufficient joint strength between the package 4 and the mother board 30.

Accordingly, a package 5 shown in FIG. 20 and FIG. 21 has been proposed in order to solve this problem. A cavity 53 is provided in the middle of the package 5. A mount surface 54 to be a joint surface when the package is mounted on a mother board is defined on a reverse surface parallel with the depth direction of the cavity 53. A pair of recesses are defined at corners where the mount surface 54 of the package 5 intersects side surfaces perpendicular to the mount surface 54, extending to a halfway position in the depth direction of the cavity 53. A conductive paste is charged in each of the recesses to thereby form a pair of external electrodes 50, 50 exposed to the mount surface 54 and the side surfaces perpendicular to the mount surface 54. Through holes are provided through a plurality of adjacent ceramic layers among a plurality of ceramic layers constituting the package 5, from a ceramic layer constituting the mount surface 54 to a ceramic layer on the halfway position in the laminating direction, and thereafter the pair of external electrodes 50, 50 are formed by charging silver pastes in the through holes.

As shown in FIG. 22, the above-described package 5 is produced by cutting, along predetermined orthogonal cutting lines, an assembled substrate 6 having an assembled structure in which each package part in the form of a rectangular parallelepiped to be one package 5 is arranged in the form of a matrix. In FIG. 22, hatching shows a cutting area to be cut with a dicing blade. A rectangular through hole 61 is provided around an intersection of two orthogonal cutting lines in a green sheet for having the pair of external electrodes 50, 50 formed therein among a plurality of green sheets constituting the assembled substrate 6. A silver paste is then charged in the through hole 61 to form a conductor charged portion 62. When the assembled substrate 6 is cut, as shown in FIG. 23 and FIG. 24, a cut is first made with a dicing blade 3 from the front surface of the assembled substrate 6 to a halfway position in the laminating direction. In this state, package parts are connected to each other on the reverse surface of the assembled substrate 6. Therefore, the assembled substrate 6 is maintained, while the conductor charged portion 62 is completely cut, so that surfaces of the external electrodes 50 shown in FIG. 21 are exposed on cut surfaces. Then, the exposed surfaces of the external electrodes 50 are plated in order to improve wettability to solder. Next, as shown in FIG. 25 and FIG. 26, the assembled substrate 6 is completely cut by making a cut with the dicing blade 3 from the reverse surface of the assembled substrate 6 to provide a plurality of packages 5 (see JP 6-96992, A).

In the above-described package 5, as shown in FIG. 27 to FIG. 29, the pair of external electrodes 50, 50 are soldered to a surface of a mother board 30 with the mount surface 54 of the package 5 being opposed to the surface of the mother board 30, i.e., with the opening direction of the cavity 53 of the package 5 being parallel with the surface of the mother board 30. As shown in FIG. 28, a solder portion 31 is formed between the surface of each external electrode 50 of the package 5 and the surface of the mother board 30. The solder portion 31 includes a base portion 32 between the surface of the mother board 30 and a surface of the external electrode 50 exposed to the mount surface 54, and a fillet portion 33 extending from the surface of the mother board 30 toward a surface of the external electrode 50 exposed to the side surface perpendicular to the mount surface 54. In the mounted structure of the package 5, because the area of the external electrode 50 exposed to the mount surface 54 is larger than the area of the external electrode 40 exposed to the mount surface 44 of the package 4 shown in FIG. 18 and FIG. 19, a joint area of the base portion 32 of the solder portion 31, i.e., mounting area can be sufficiently secured as shown in FIG. 28 between the external electrode 50 exposed to the mount surface 54 and the surface of the mother board 30. This provides more joint strength between the package 5 and the mother board 30 than the joint strength between the package 4 and the mother board 30 shown in FIG. 18 and FIG. 19.

However, a joint strength between the package 5 and the mother board 30 is insufficient even using the mounted structure with the above-described package 5 because, as shown in FIG. 29, the package 5 cannot be joined on the surface of the mother board 30 in the area where the external electrode 50 of the package 5 is not formed, so that the package 5 is isolated from the surface of the mother board 30.

Accordingly, there is a possible method for increasing a joint strength with the mother board 30. This method includes providing through holes penetrating through all the ceramic layers constituting the package 5 shown in FIG. 22, and thereafter charging silver pastes in the through holes to thereby form the pair of external electrodes 50, 50 over the entire length at both ends of the mount surface 54 of the package 5.

However, when the external electrode 50 is plated, the entire surface of the external electrode 50 needs to be exposed. According to the above-described method, the surface of the external electrode 50 can be plated only after the assembled substrate 6 is cut into separate pieces. This makes a plating process more complicated than that of the conventional method in which the external electrode 50 can be plated within the assembled substrate 6. Therefore, it has been impossible to use the above-described method. Consequently, a joint strength between the package 5 and the mother board 30 has not yet been sufficient.

SUMMARY OF THE INVENTION

An object of the present invention is to provide an electronic component mounting package, and a manufacturing method therefor, in which a joint strength with a mother board can be increased without making a manufacturing process complicated, and to provide a package assembled substrate, which is an intermediate product thereof.

An electronic component mounting package of the present invention has a laminate structure of a plurality of ceramic layers, and has a mount surface to be a joint surface when mounted on a substrate, defined to be in parallel with a laminating direction. At least one ceramic layer of the plurality of ceramic layers has a recess defined at each of two corners defined by an intersection of the mount surface and two side surfaces perpendicular to the mount surface, and a pair of charged electrode portions formed by charging a conductive paste in each recess and exposed to the mount surface and the side surfaces perpendicular to the mount surface, and at least one ceramic layer of the ceramic layers other than the ceramic layer having the charged electrode portions formed therein has a recess defined at each of two corners defined by intersection of the mount surface and two side surfaces perpendicular to the mount surface, and a pair of coated electrode portions formed by forming a film of a conductive material on a surface of each recess, the charged electrode portions and the coated electrode portions being soldered to a surface of the substrate when the package is mounted.

The above-described electronic component mounting package of the present invention is mounted on a mother board with the mount surface being opposed to a surface of the mother board. In this state, in the area where the charged electrode portions are formed, a large mounting area can be secured between surfaces of the charged electrode portions exposed to the mount surface and the surface of the mother board opposed thereto. This allows the package to be firmly joined to the mother board. Also in the area of the package where the coated electrode portions are formed, the package can be joined to the mother board, although the area of the coated electrode portions exposed to the mount surface, i.e., mounting area is small.

A manufacturing method for the electronic component mounting package of the present invention has an assembled substrate producing step of laminating a plurality of green sheets to be the plurality of ceramic layers to produce a package assembled substrate having an assembled structure in which each package part in the form of a rectangular parallelepiped to be one electronic component mounting package is arranged in the form of a matrix, and a cutting step of cutting the package assembled substrate obtained through the assembled substrate producing step along a predetermined cutting line into each package part, the assembled substrate producing step including the steps of laminating a plurality of green sheets to produce a first laminated body and a second laminated body, and stacking the first laminated body and the second laminated body to produce the package assembled substrate, the step of producing the first laminated body including providing a first through hole around an intersection of two orthogonal cutting lines in at least one green sheet of a plurality of green sheets constituting the first laminated body, and charging a conductive paste in the first through hole to form a conductor charged portion, the step of producing the second laminated body including providing a second through hole around the intersection in at least one green sheet of a plurality of green sheets constituting the second laminated body, and forming a film of a conductive material on an inner surface of the second through hole to form a conductive film.

The cutting step has a first cutting step of making a cut along the predetermined cutting line from a surface of the first laminated body of the package assembled substrate to thereby cut all the green sheets having the conductor charged portion formed therein, while leaving uncut at least one green sheet in the second laminated body of the package assembled substrate, a plating step of plating a surface of the conductor charged portion and a surface of the conductive film exposed on a cut surface after the first cutting step, and a second cutting step of making a cut in the package assembled substrate along the predetermined cutting line to thereby cut all the green sheets left uncut at the first cutting step.

According to the above-described manufacturing method for the package of the present invention, after the first cutting step, surfaces of the charged electrode portion and the coated electrode portion of the package are exposed on cut surfaces of the assembled substrate, so that the exposed charged electrode portion and coated electrode portion can be plated within the assembled substrate. Therefore, a manufacturing process of the package will not be made complicated.

A package assembled substrate of the present invention has a laminate structure of a plurality of ceramic layers, and an assembled structure in which each package part in the form of a rectangular parallelepiped to be one electronic component mounting package is arranged in the form of a matrix, and provides a plurality of electronic component mounting packages to be cut out by cutting the substrate along a predetermined cutting line extending between two adjacent package parts. The package assembled substrate of the present invention includes a first through hole provided around an intersection of two orthogonal cutting lines in at least one ceramic layer of a plurality of ceramic layers constituting four package parts assembled around the intersection, a conductor charged portion formed by charging a conductive paste in the first through hole, a second through hole provided around the intersection in at least one ceramic layer of the ceramic layers other than the ceramic layer having the conductor charged portion formed therein, and a conductive film formed by forming a film of a conductive material on an inner surface of the second through hole.

According to the above-described package assembled substrate of the present invention, the conductor charged portion and the conductive film are divided into four by cutting the package assembled substrate along two orthogonal cutting lines. This forms charged electrode portions and charged electrode portions of four package parts assembled around the intersection of the two cutting lines.

As described above, according to the electronic component mounting package and the manufacturing method therefor, and to the package assembled substrate of the present invention, which is an intermediate product thereof, a joint strength with a mother board can be increased without making a manufacturing process complicated.

DETAILED DESCRIPTION OF THE INVENTION

An embodiment of the present invention will be specifically described below with reference to the drawings.

Figure 1:
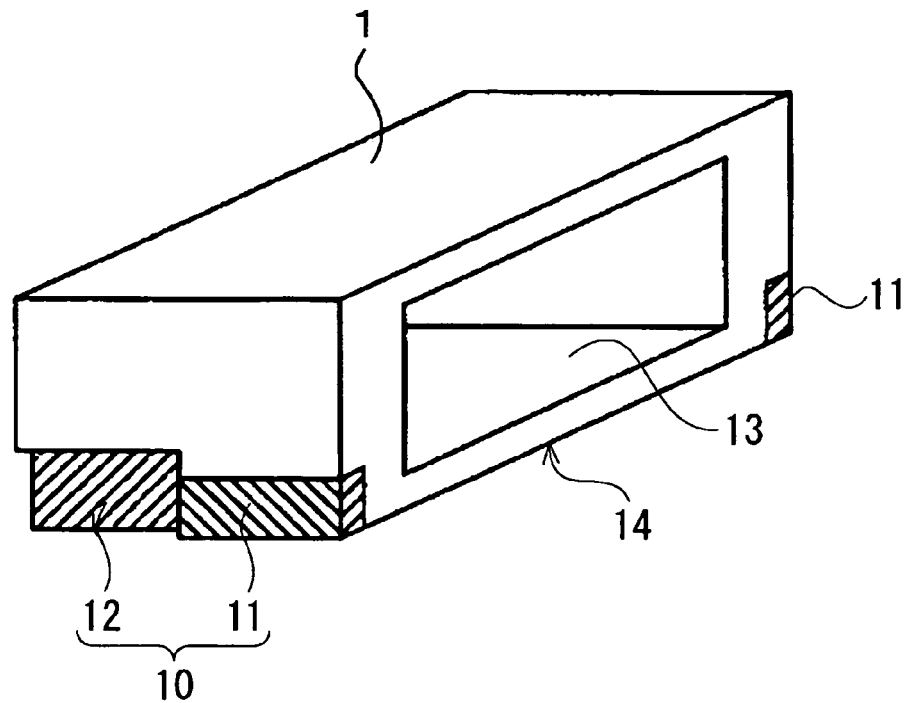
FIG. 1 is a perspective view showing a mounted posture of a package for a light emitting element of the present invention.
Figure 2:
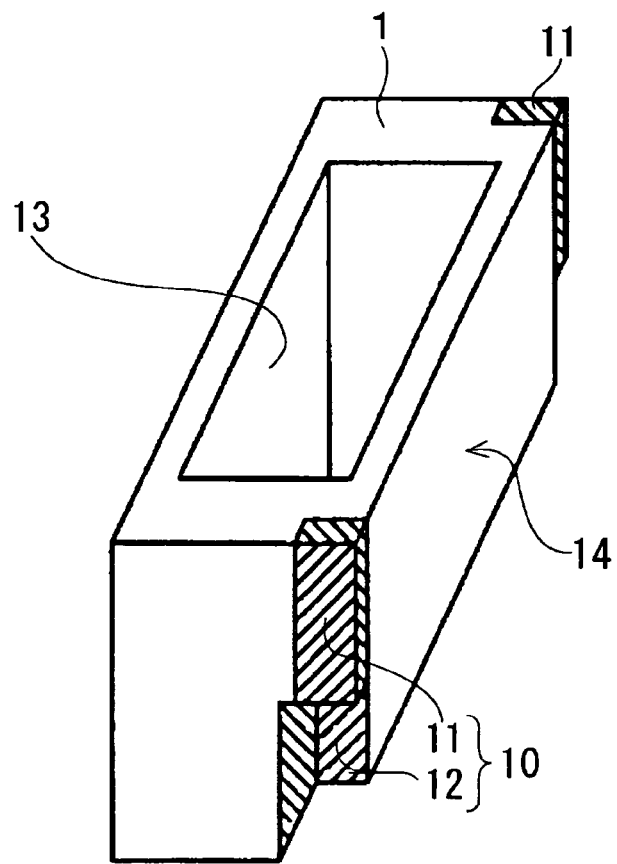
FIG. 2 is a perspective view showing a laminated posture of the package.

As shown in FIG. 1 and FIG. 2, a package 1 for a light emitting element of the present invention includes a cavity 13 for housing a light emitting element such as an LED in the middle thereof. A mount surface 14 to be a joint surface when the package is mounted on a mother board is defined on a side surface parallel with the depth direction of the cavity 13. A plurality of ceramic layers constituting the package 1 are laminated in the depth direction of the cavity 13. A pair of external electrodes 10, 10 each including a charged electrode portion 11 and a coated electrode portion 12 are formed over the entire length in the laminating direction at two corners defined by intersection of the mount surface 14 of the package 1 and two side surfaces perpendicular to the mount surface 14. The charged electrode portion 11 and the coated electrode portion 12 are shown by hatching for convenience of illustration. Defined at the two corners are a pair of first recesses extending from ends of a surface having the opening of the cavity 13 to halfway positions in the laminating direction, and a pair of second recesses extending from the halfway positions to ends opposite to the surface having the opening of the cavity 13. A pair of charged electrode portions 11, 11 are formed by charging silver pastes in the first recesses, and surfaces thereof are exposed to the mount surface 14 of the package 1 and the side surfaces perpendicular to the mount surface 14. A pair of coated electrode portions 12, 12 are formed by forming films of a conductive material on surfaces of the second recesses.

A producing method for the package 1 will be described below.

Figure 3:
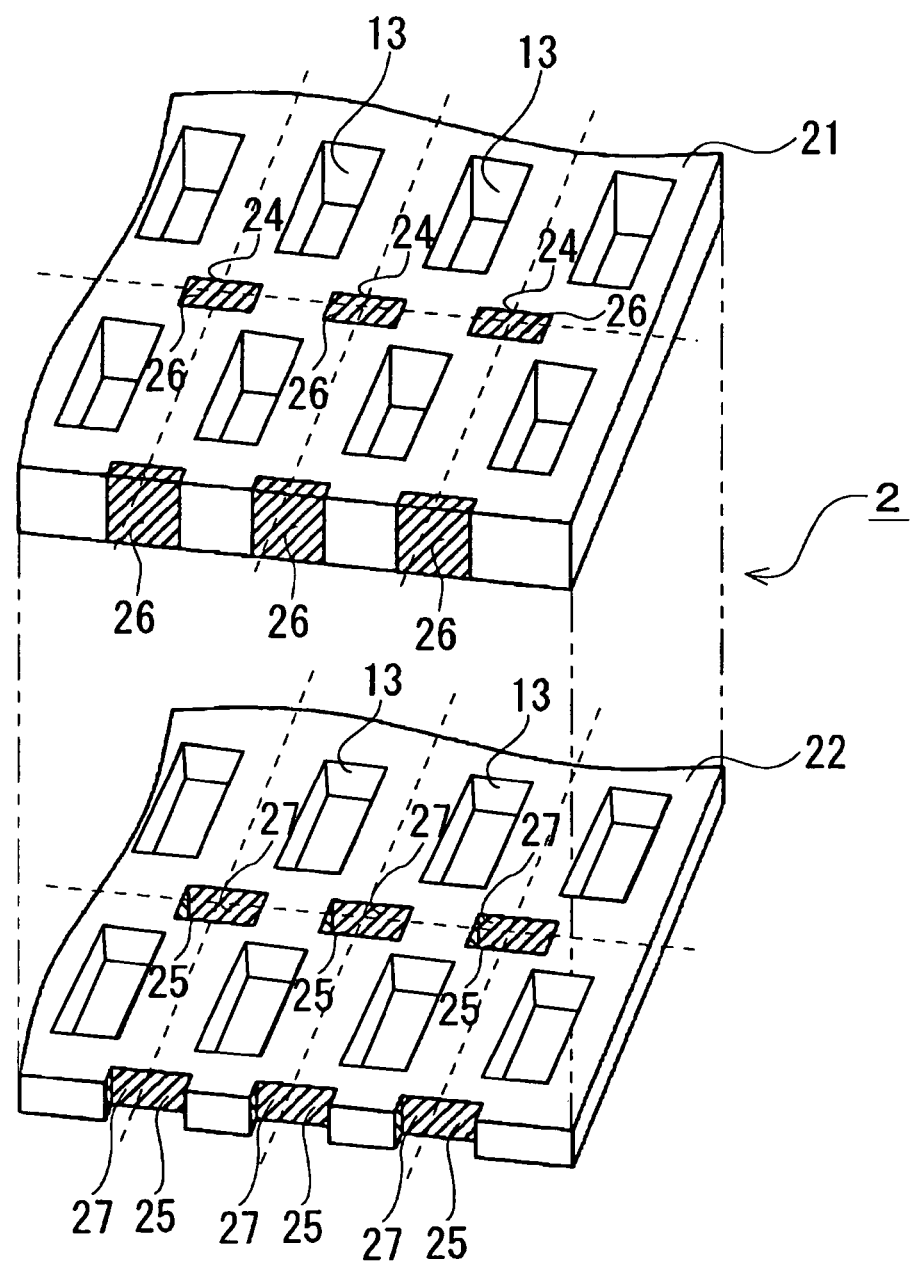
FIG. 3 is an exploded perspective view of an assembled substrate, which is an intermediate product of the package.

As shown in FIG. 3, the above-described package 1 is produced by cutting, along predetermined orthogonal cutting lines shown by broken lines in FIG. 3, an assembled substrate 2 having an assembled structure in which each package part in the form of a rectangular parallelepiped to be one package 1 is arranged in the form of a matrix. The assembled substrate 2 is formed by stacking a first laminated body 21 including a plurality of ceramic layers for having the charged electrode portion 11 formed therein and a second laminated body 22 including a plurality of ceramic layers for having the coated electrode portion 12 formed therein.

The first laminated body 21 is provided with a plurality of first rectangular through holes 24-24 around intersections of two orthogonal cutting lines. A silver paste is charged in each of the first through holes 24 to thereby form a conductor charged portion 26. The second laminated body 22 is provided with a plurality of second rectangular through holes 25-25 having an opening area slightly larger than that of the first through holes 24 around intersections of the two cutting lines. A film of a conductive material is formed on the inner surface of each of the second through holes 25 to thereby form a conductive film 27.

Figure 4:
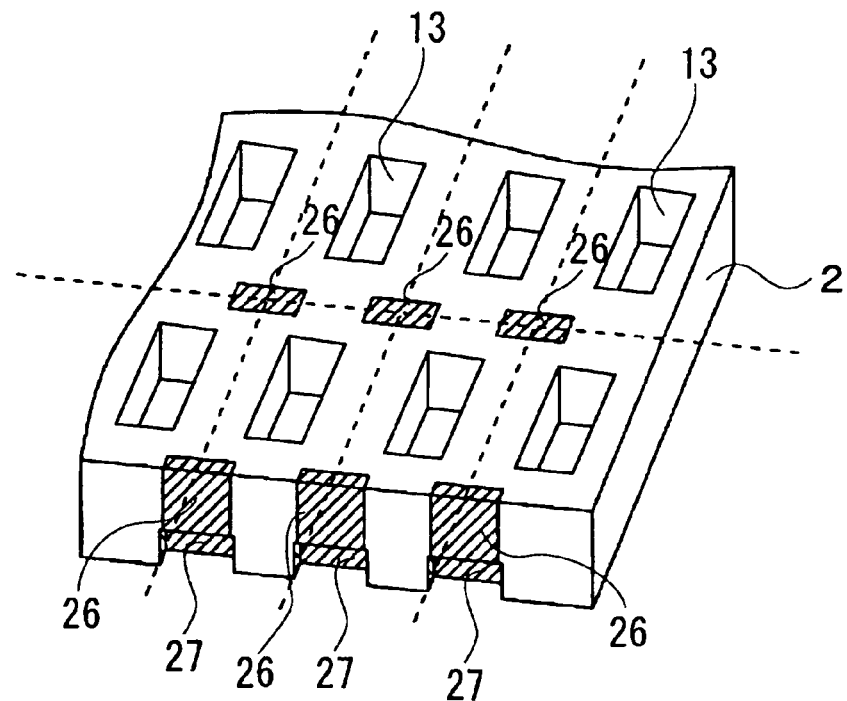
FIG. 4 is a perspective view illustrating a first cutting step for the assembled substrate.
Figure 5:
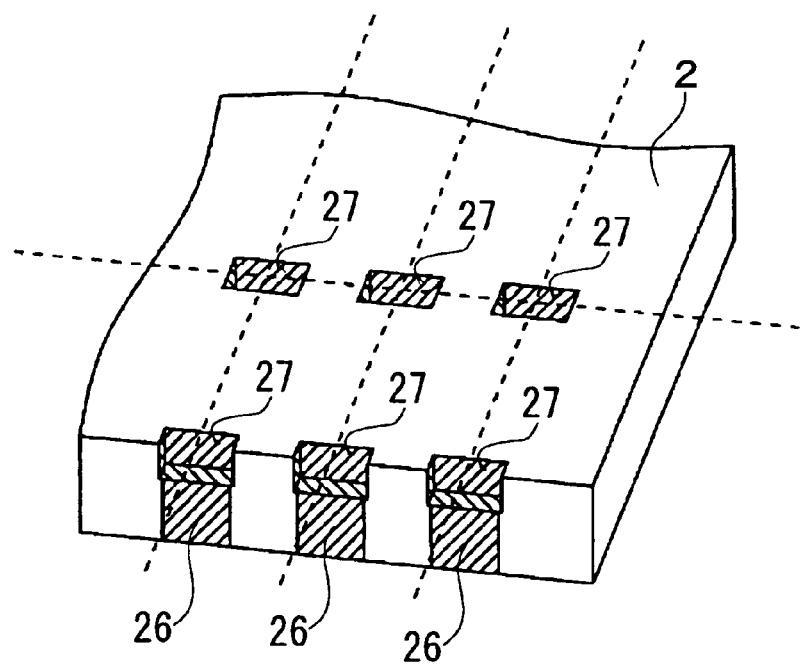
FIG. 5 is a perspective view illustrating a second cutting step for the assembled substrate.

The above-described package 1 is produced through a first cutting step, as shown in FIG. 4, of making a cut in the assembled substrate 2 from a surface of the assembled substrate 2 in the side of the first laminated body 21 (hereinafter referred to as a front surface of the assembled substrate 2) to a halfway position in the laminating direction of the assembled substrate 2 where the conductor charged portion 26 can be completely cut, and a second cutting step, as shown in FIG. 5, of making a cut in the assembled substrate 2 after the first cutting step from a surface of the assembled substrate 2 in the side of the second laminated body 22 (hereinafter referred to as a reverse surface of the assembled substrate 2) to completely cut the assembled substrate 2.

Figure 6:
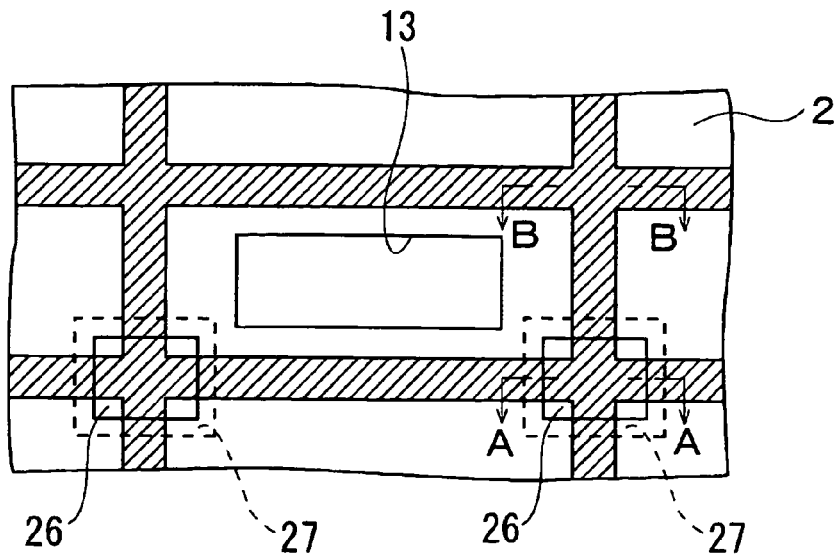
FIG. 6 is a plan view showing a cutting position of the assembled substrate.
Figure 7:
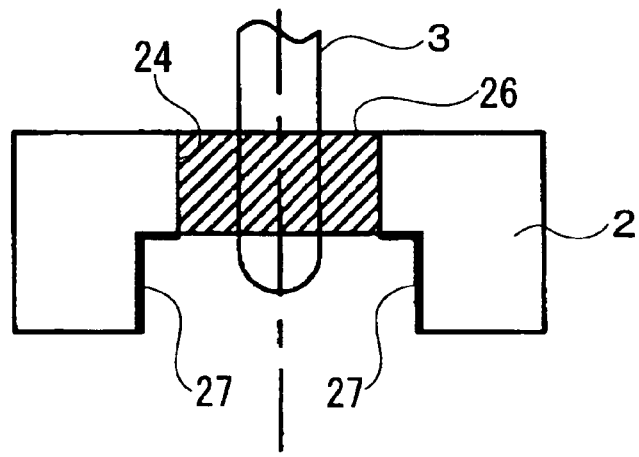
FIG. 7 is A-A sectional view of FIG. 6 during the first cutting step.
Figure 8:
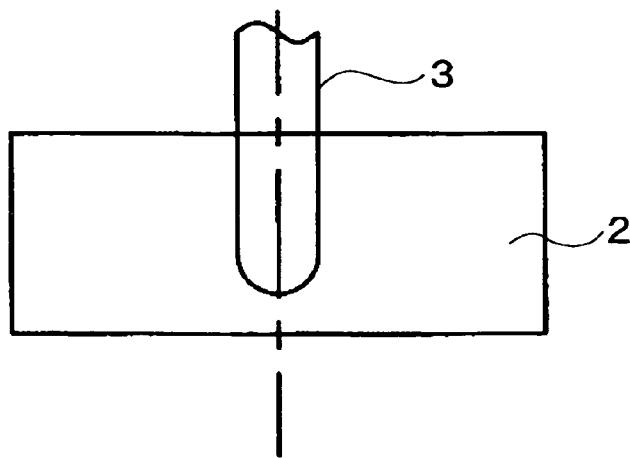
FIG. 8 is B-B sectional view of FIG. 6 during the first cutting step.
Figure 9:
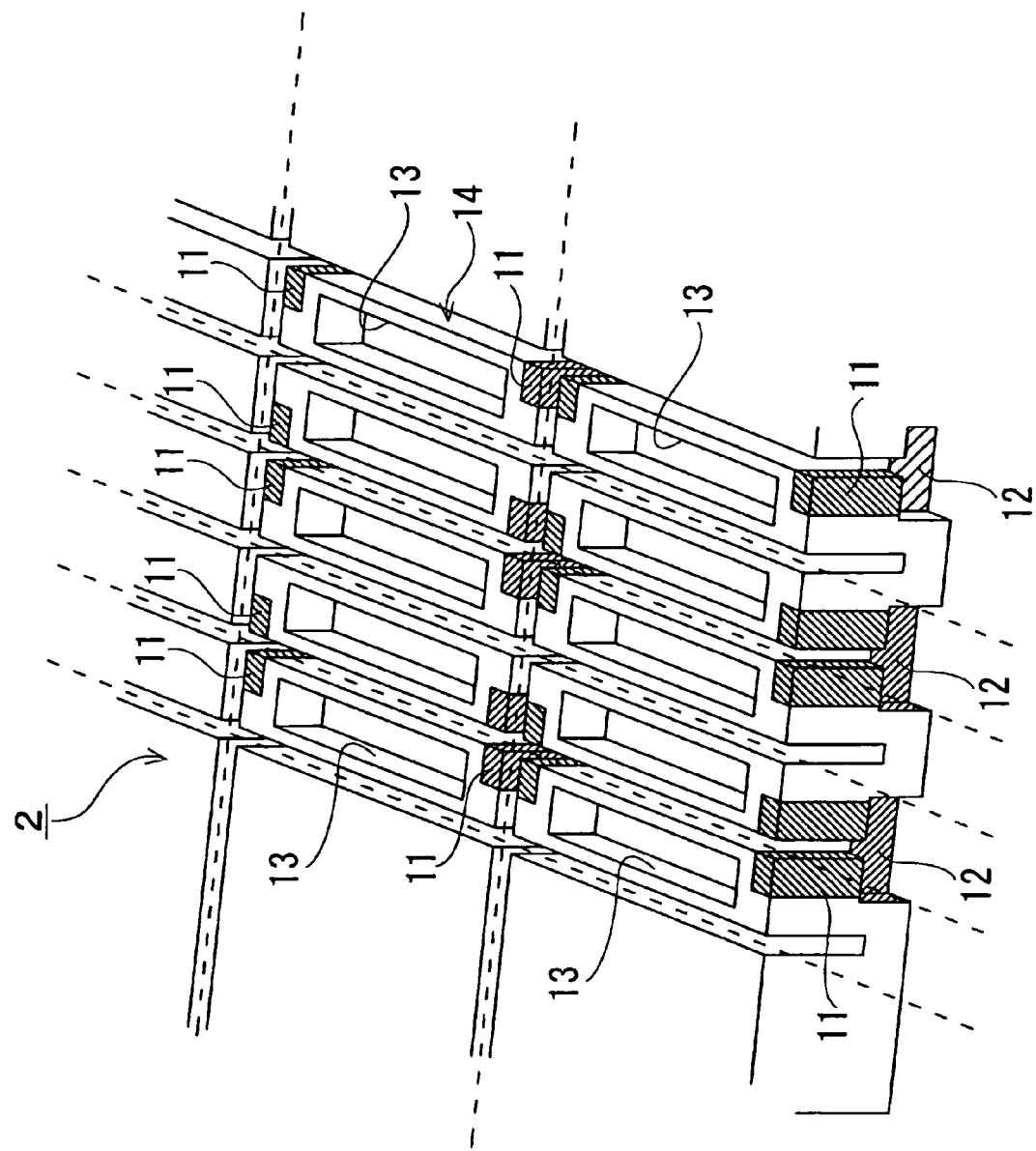
FIG. 9 is a perspective view showing the assembled substrate after the first cutting step.

The assembled substrate 2 is cut with a dicing blade at the first and second cutting steps. In FIG. 6, hatching shows a cutting area with the dicing blade. In the first cutting step, as shown in FIG. 7 and FIG. 8, a cut is made with a dicing blade 3 from the front surface of the assembled substrate 2 to a halfway position in the laminating direction to thereby completely cut the conductor charged portion 26. FIG. 9 shows the assembled substrate 2 after the first cutting step. In this state, package parts are connected to each other on the reverse surface of the assembled substrate 2. Therefore, the assembled substrate 2 is maintained, while surfaces of the charged electrode portion 11 and the coated electrode portion 12 of the package 1 are exposed on a cut surface of the assembled substrate 2. Then, after the assembled substrate 2 is fired, the exposed surfaces of the charged electrode portion 11 and the coated electrode portion 12 are plated in order to improve wettability to solder.

Figure 10:
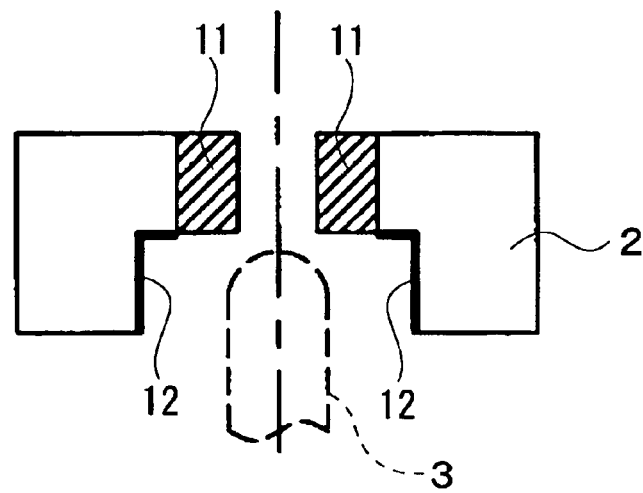
FIG. 10 is A-A sectional view of FIG. 6 during the second cutting step.
Figure 11:
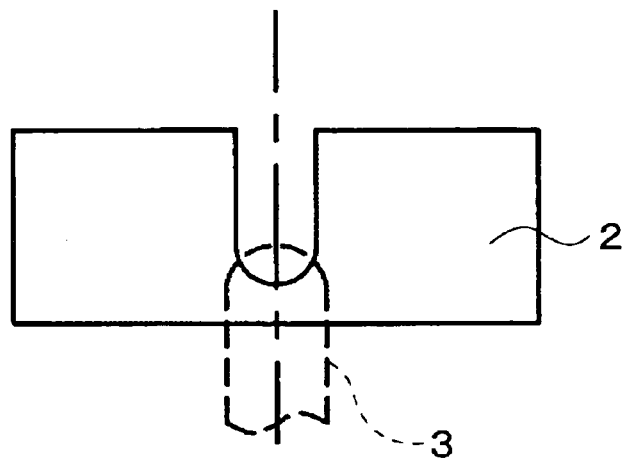
FIG. 11 is B-B sectional view of FIG. 6 during the second cutting step.

Thereafter, as shown in FIG. 10 and FIG. 11, the assembled substrate 2 is completely cut by making a cut with the dicing blade 3 at the second cutting step from the reverse surface of the assembled substrate 2 to complete the package 1 shown in FIG. 1 and FIG. 2. In the present embodiment, firing is performed between the first cutting step and the plating step, but, without limiting to this, the firing may be performed between a laminating step and the first cutting step, for example.

Figure 12:
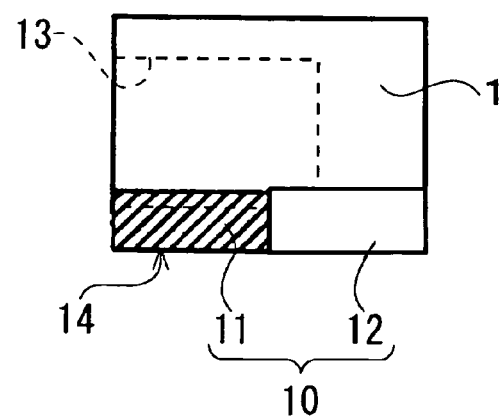
FIG. 12 is a side view showing a mounted posture of the package.
Figure 13:
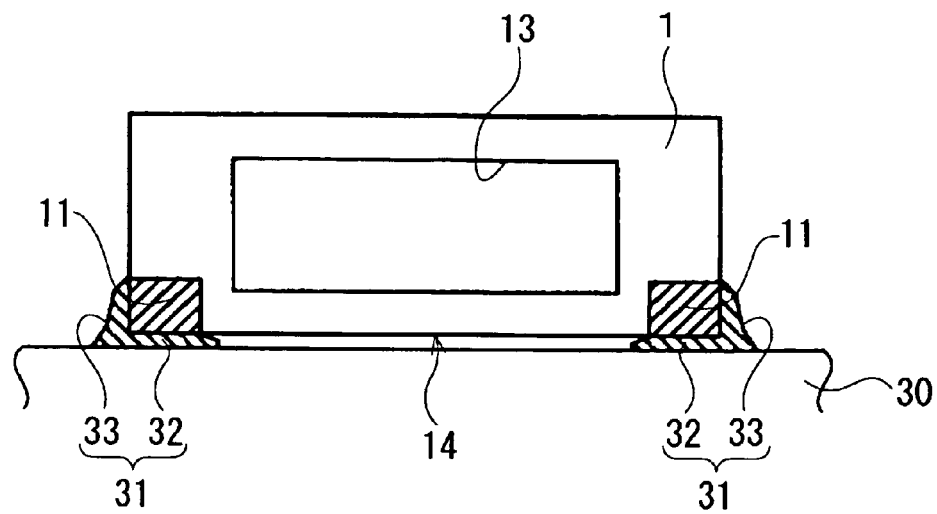
FIG. 13 is a front view of a mounted state of the package viewed from the opening direction of a cavity.
Figure 14:
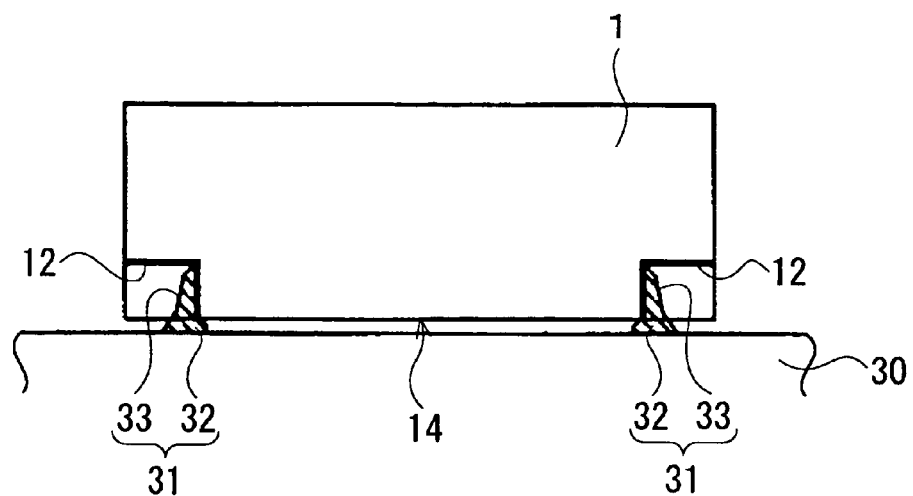
FIG. 14 is a reverse view of the mounted state of the package viewed from the opposite side to the opening direction of the cavity.

In the above-described package 1, as shown in FIG. 12 to FIG. 14, the pair of external electrodes 10, 10 are soldered to a surface of a mother board 30 with the mount surface 14 of the package 1 being opposed to the surface of the mother board 30, i.e., with the opening direction of the cavity 13 of the package 1 being parallel with the surface of the mother board 30. In the area where the charged electrode portion 11 of the package 1 is formed, as shown in FIG. 13, a solder portion 31 is formed between the surface of each charged electrode portion 11 of the package 1 and the surface of the mother board 30. The solder portion 31 includes a base portion 32 between the surface of the mother board 30 and a surface of the charged electrode portion 11 exposed to the mount surface 14, and a fillet portion 33 extending from the surface of the mother board 30 toward a surface of the charged electrode portion 11 exposed to the side surface perpendicular to the mount surface 14.

In the area where the charged electrode portion 11 is formed, a joint area of the base portion 32 of the solder portion 31, i.e., mounting area can be sufficiently secured between the surface of the charged electrode portion 11 exposed to the mount surface 14 and the surface of the mother board 30. Therefore, the package 1 can be firmly joined to the mother board 30.

In the area where the coated electrode portion 12 of the package 1 is formed, as shown in FIG. 14, a solder portion 31 is formed between the surface of each coated electrode portion 12 of the package 1 and the surface of the mother board 30. The solder portion 31 includes a base portion 32 between the surface of the mother board 30 and an end surface of the coated electrode portion 12 slightly exposed to the mount surface 14, and a fillet portion 33 extending from the surface of the mother board 30 toward a surface of the coated electrode portion 12 exposed to the side surface perpendicular to the mount surface 14.

In the area where the coated electrode portion 12 is formed, because the area of the coated electrode portion 12 exposed to the mount surface 14 is extremely small, a joint area of the base portion 32 of the solder portion 31, i.e., mounting area cannot be sufficiently secured between the exposed surface of the coated electrode portion 12 to the mount surface 14 and the surface of the mother board 30. However, the package 1 can be joined to the mother board 30 at the base portion 32 and the fillet portion 33 of the solder portion 31.

Figure 15:
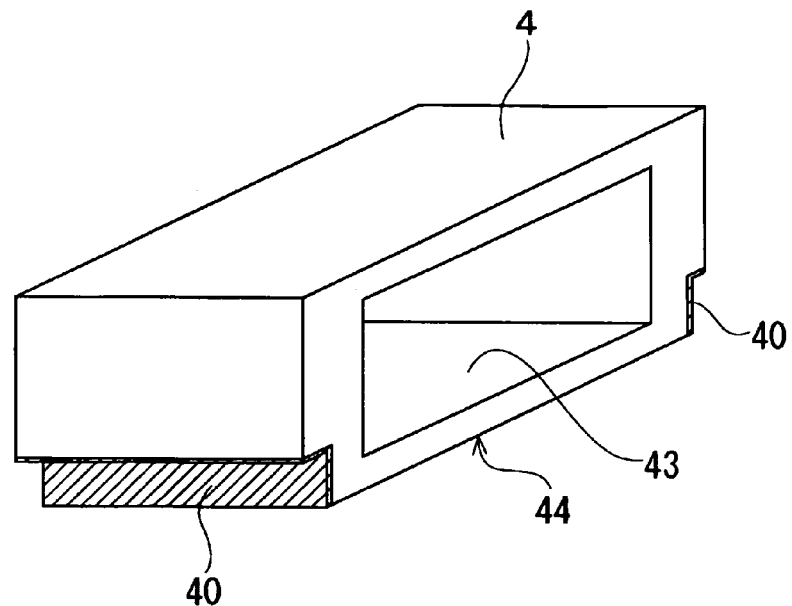
FIG. 15 is a perspective view showing a structure of a conventional package for a light emitting element.
Figure 16:
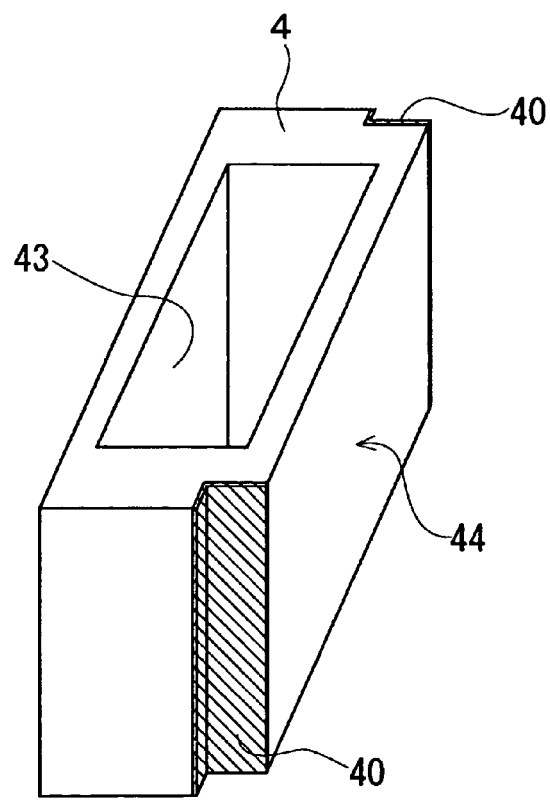
FIG. 16 is a perspective view showing a laminated posture of the package.
Figure 17:
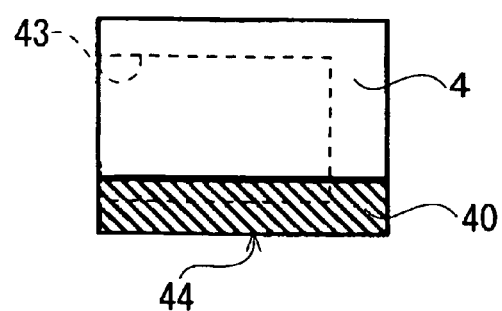
FIG. 17 is a side view showing a mounted posture of the package.
Figure 18:
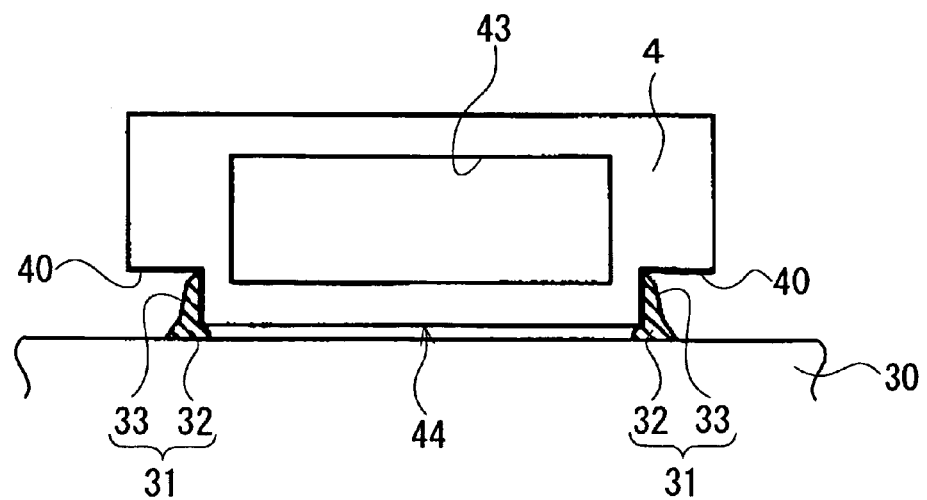
FIG. 18 is a front view of a mounted state of the package viewed from the opening direction of a cavity.
Figure 19:
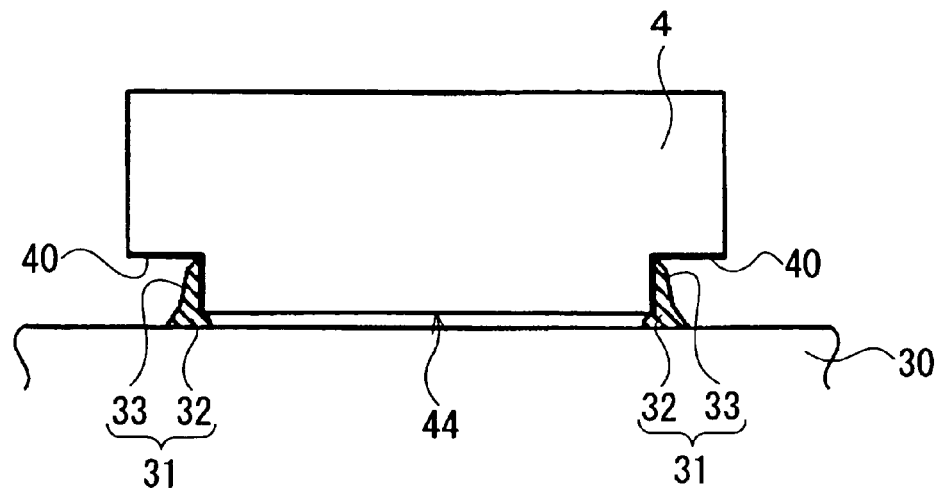
FIG. 19 is a reverse view of the mounted state of the package viewed from the opposite side to the opening direction of the cavity.

In the conventional package 4 shown in FIG. 15 and FIG. 16, a through hole is provided over the entire length at each end of the mount surface to form the external electrode 40 on the surface of the through hole. As shown in FIG. 18 and FIG. 19, the area of the external electrode 40 exposed to the mount surface 44, i.e., mounting area is extremely small. This has been causing a problem of an insufficient joint strength between the package 4 and the mother board 30. In contrast, according to the package 1 of the present invention, a large mounting area can be secured in the area where the charged electrode portion 11 is formed. This provides a more increased joint strength with the mother board 30 than that of the conventional package 4.

Figure 20:
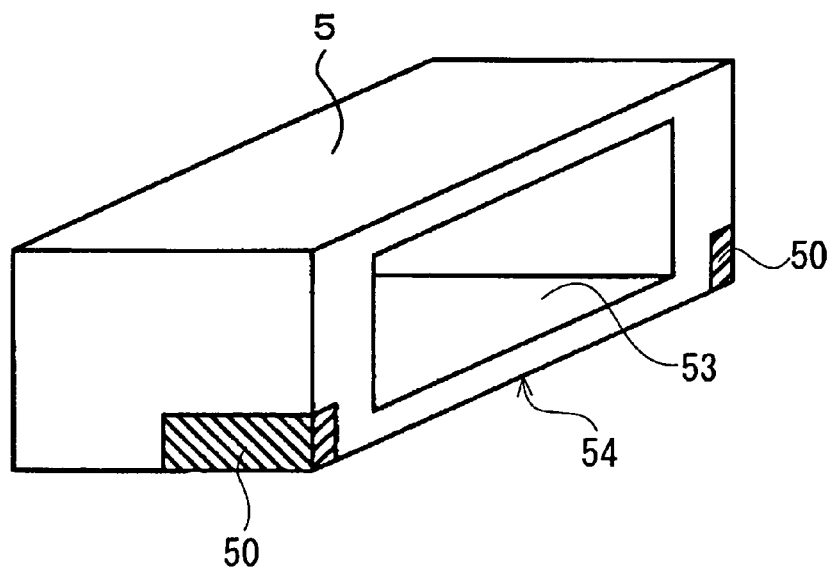
FIG. 20 is a perspective view showing another structure of a conventional package for a light emitting element.
Figure 21:
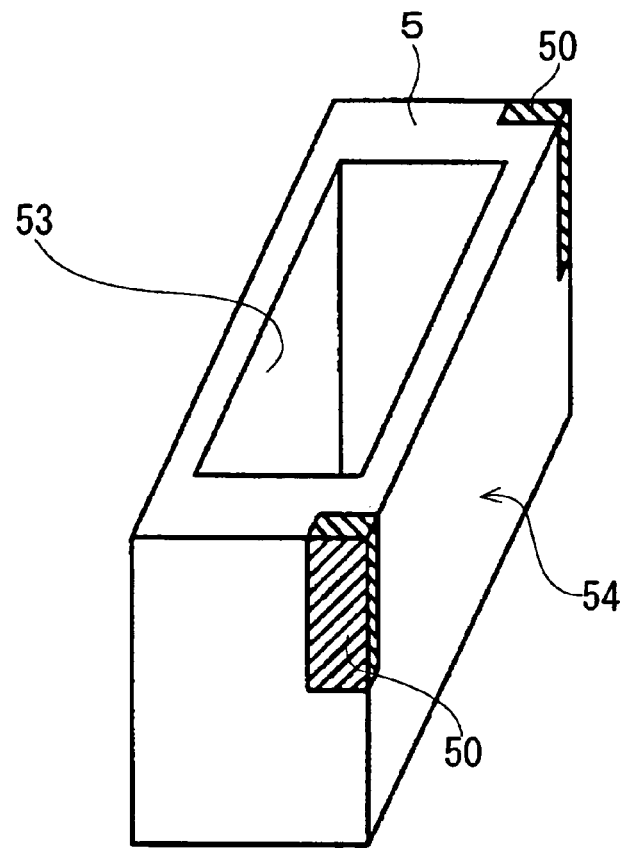
FIG. 21 is a perspective view showing a laminated posture of the package.
Figure 22:
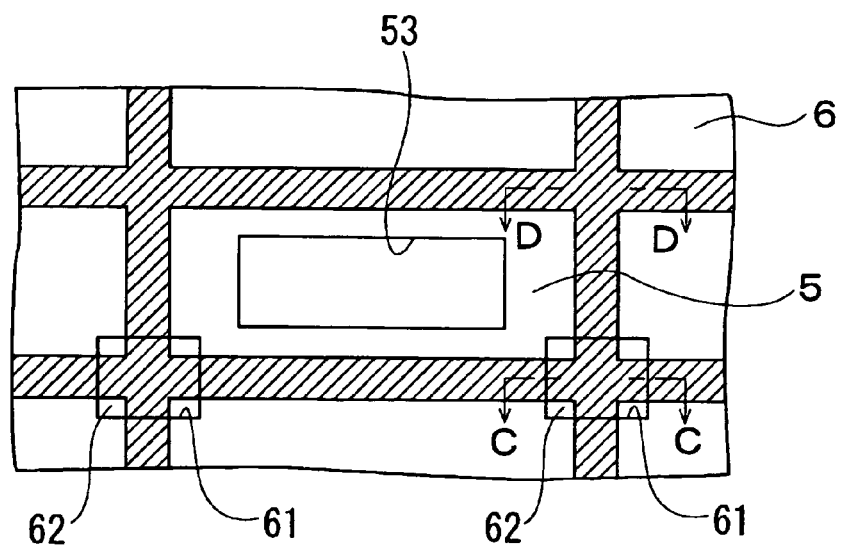
FIG. 22 is a plan view showing a cutting position of an assembled substrate, which is an intermediate product of the package.
Figure 23:
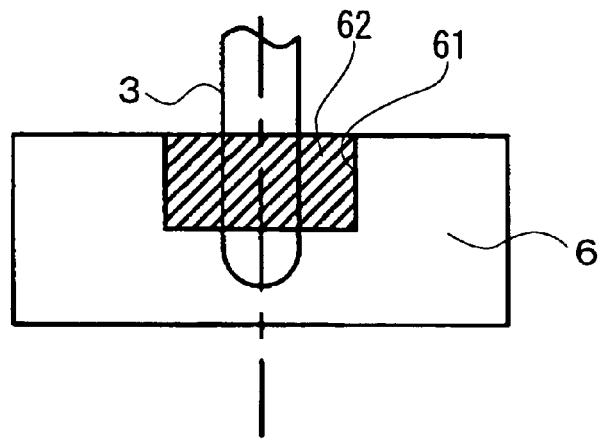
FIG. 23 is C-C sectional view of FIG. 22 during a first cutting step.
Figure 24:
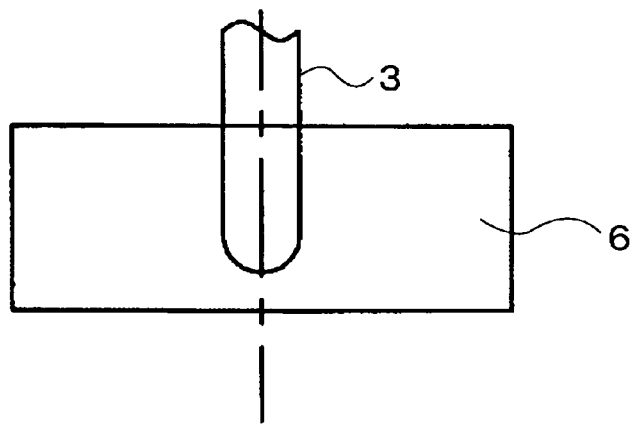
FIG. 24 is D-D sectional view of FIG. 22 during the first cutting step.
Figure 25:
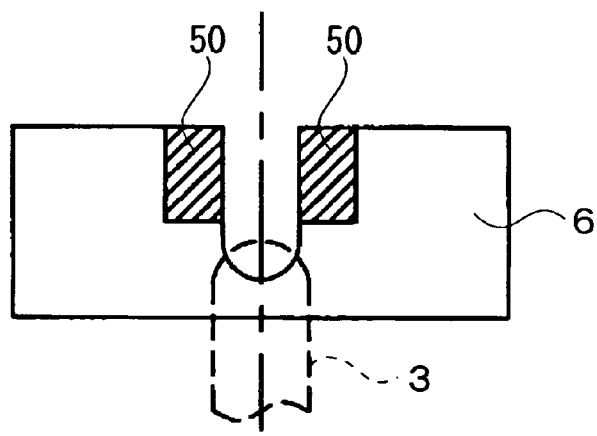
FIG. 25 is C-C sectional view of FIG. 22 during a second cutting step.
Figure 26:
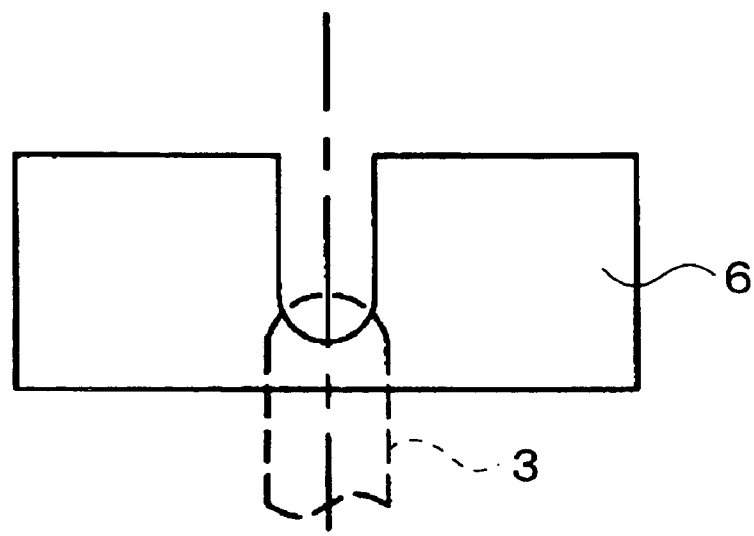
FIG. 26 is D-D sectional view of FIG. 22 during the second cutting step.
Figure 27:
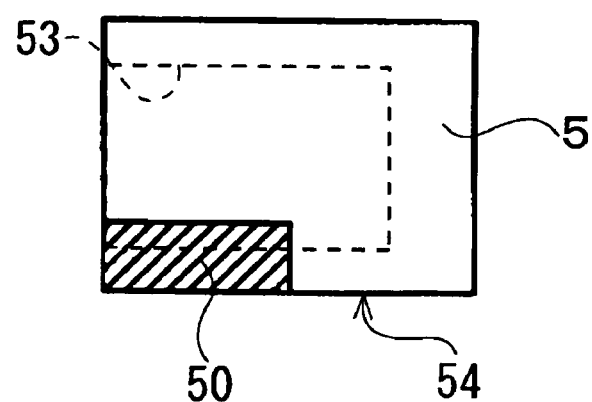
FIG. 27 is a side view showing a mounted posture of the package.
Figure 28:
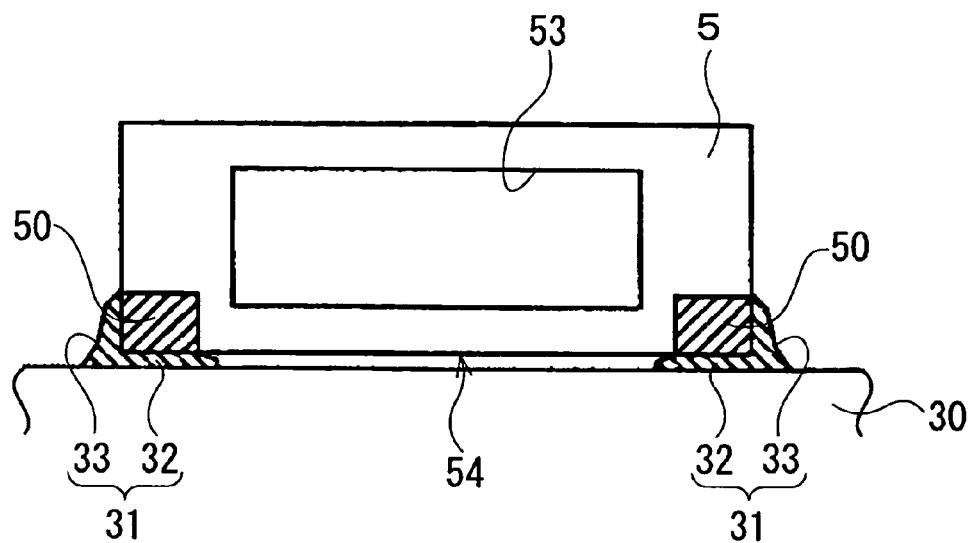
FIG. 28 is a front view of a mounted state of the package viewed from the opening direction of a cavity.
Figure 29:
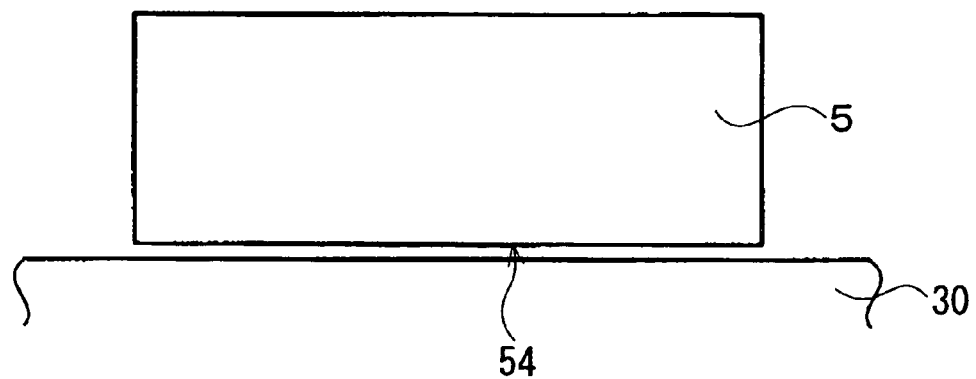
FIG. 29 is a reverse view of the mounted state of the package viewed from the opposite side to the opening direction of the cavity.

In the conventional package shown in FIG. 20 and FIG. 21, the external electrode 50 having a surface exposed to the mount surface 54 is formed at a part of each end of the mount surface in order to increase a joint strength with the mother board 30. Because the external electrode 50 is exposed to the mount surface 54, a large mounting area can be secured as shown in FIG. 28 in the area where the external electrode 50 is formed. However, the package 5 is isolated from the surface of the mother board 30 as shown in FIG. 29 in the area where the external electrode 50 is not formed. This has been causing a problem of an insufficient joint strength of the package 5 and the mother board 30. In contrast, according to the package 1 of the present invention, the coated electrode portion 12 is formed in the area where the external electrode 50 is not formed in the conventional package 5, so that the package 1 can be joined to the mother board 30 also in the area where the coated electrode portion 12 is formed. This provides a more increased joint strength with the mother board 30 than that of the conventional package 5.

Therefore, the above-described package 1 of the present invention provides increased joint strength with the mother board than that of any of the above-described conventional packages. In addition, according to the manufacturing method for the package 1 of the present invention, as shown in FIG. 9, surfaces of the charged electrode portion 11 and the coated electrode portion 12 of the package 1 are exposed on cut surfaces of the assembled substrate 2 after the first cutting step, so that the exposed surfaces of the charged electrode portion 11 and the coated electrode portion 12 can be plated within the assembled substrate 2. This prevents the manufacturing process, for package 1, from being made complicated.

The present invention is not limited to the foregoing embodiment in construction but can be modified variously by one skilled in the art without departing from the spirit of the invention set forth in the appended claims. For example, in the present embodiment, either the charged electrode portion 11 or the coated electrode portion 12 is formed in all the ceramic layers constituting the package 1, but, without limiting to this, a structure may be used in which, for example, the charged electrode portion 11 is formed in a part of ceramic layers among a plurality of ceramic layers constituting the package 1, while the coated electrode portion 12 is formed in a part of ceramic layers among the ceramic layers other than the ceramic layers having the charged electrode portion 11 formed therein.

What is claimed is:

1. An electronic component mounting package having a laminate structure of a plurality of ceramic layers, comprising:
    a mount surface to be a joint surface when mounted on a substrate, defined to be in parallel with a laminating direction, wherein at least one ceramic layer of the plurality of ceramic layers has a recess defined at each of two corners defined by an intersection of the mount surface and two side surfaces perpendicular to the mount surface, and a pair of charged electrode portions formed by charging a conductive paste in each recess and exposed to the mount surface and the side surfaces perpendicular to the mount surface, and at least one ceramic layer of the ceramic layers other than the ceramic layer having the charged electrode portions formed therein has a recess defined at each of two corners defined by an intersection of the mount surface and two side surfaces perpendicular to the mount surface, and a pair of coated electrode portions formed by forming a film of a conductive material on a surface of each recess, the charged electrode portions and the coated electrode portions being soldered to a surface of the substrate when the package is mounted.

2. A manufacturing method for an electronic component mounting package having a laminate structure of a plurality of ceramic layers, and having a mount surface to be a joint surface when mounted on a substrate, defined to be in parallel with a laminating direction, the method for manufacturing the electronic component mounting package comprising:
    an assembled substrate producing step of laminating a plurality of green sheets to be the plurality of ceramic layers to produce a package assembled substrate having an assembled structure in which each package part in the form of a rectangular parallelepiped to be one electronic component mounting package is arranged in the form of a matrix; and
    a cutting step of cutting the package assembled substrate obtained through the assembled substrate producing step along a predetermined cutting line into each package part,
    the assembled substrate producing step comprising the steps of laminating a plurality of green sheets to produce a first laminated body and a second laminated body, and stacking the first laminated body and the second laminated body to produce the package assembled substrate, the step of producing the first laminated body comprising providing a first through hole around an intersection of two orthogonal cutting lines in at least one green sheet of a plurality of green sheets constituting the first laminated body, and charging a conductive paste in the first through hole to form a conductor charged portion, the step of producing the second laminated body comprising providing a second through hole around the intersection in at least one green sheet of a plurality of green sheets constituting the second laminated body, and forming a film of a conductive material on an inner surface of the second through hole to form a conductive film, the cutting step comprising:
    a first cutting step of making a cut along the predetermined cutting line from a surface of the first laminated body of the package assembled substrate to thereby cut all the green sheets having the conductor charged portion formed therein, while leaving uncut at least one green sheet in the second laminated body of the package assembled substrate;
    a plating step of plating a surface of the conductor charged portion and a surface of the conductive film exposed on a cut surface after the first cutting step; and
    a second cutting step of making a cut in the package assembled substrate along the predetermined cutting line to thereby cut all the green sheets left uncut at the first cutting step.

3. A package assembled substrate having a laminate structure of a plurality of ceramic layers, and an assembled structure in which each package part in the form of a rectangular parallelepiped to be one electronic component mounting package is arranged in the form of a matrix, and providing a plurality of electronic component mounting packages to be cut out by cutting the substrate along a predetermined cutting line extending between two adjacent package parts, the package assembled substrate comprising a first through hole provided around an intersection of two orthogonal cutting lines in at least one ceramic layer of a plurality of ceramic layers constituting four package parts assembled around the intersection, a conductor charged portion formed by charging a conductive paste in the first through hole, a second through hole provided around the intersection in at least one ceramic layer of the ceramic layers other than the ceramic layer having the conductor charged portion formed therein, and a conductive film formed by forming a film of a conductive material on an inner surface of the second through hole.

* * * * *